United States Patent [19]
Bylander

[11] 3,793,714
[45] Feb. 26, 1974

[54] INTEGRATED CIRCUIT ASSEMBLY USING ETCHED METAL PATTERNS OF FLEXIBLE INSULATING FILM

[75] Inventor: Ernest Gerald Bylander, McKinney, Tex.

[73] Assignee: Texas Instruments Incorporated, Dallas, Tex.

[22] Filed: May 27, 1971

[21] Appl. No.: 147,577

[52] U.S. Cl. .......... 29/583, 29/588, 29/589, 29/591, 228/3, 228/4, 228/6
[51] Int. Cl. .......... H01l 7/66
[58] Field of Search ..... 29/583, 588, 589, 591, 576; 174/DIG. 3; 228/1, 3, 3.5, 4, 6

[56] References Cited

UNITED STATES PATENTS

| | | | |
|---|---|---|---|
| 3,689,991 | 9/1972 | Aird | 29/589 |
| 3,544,857 | 12/1970 | Byrne et al. | 317/234 |
| 3,539,259 | 10/1970 | Hillman et al. | 174/3 |
| 3,469,684 | 9/1969 | Keady et al. | 29/626 X |
| 3,404,319 | 10/1968 | Tsuji et al. | 174/3 |
| 3,389,723 | 6/1968 | Litterst et al. | 141/90 |
| 3,382,564 | 5/1968 | Gallentine | 29/471.1 |
| 3,255,511 | 6/1966 | Weissenstern et al. | 29/588 |

*Primary Examiner*—J. Spencer Overholser
*Assistant Examiner*—Robert J. Craig
*Attorney, Agent, or Firm*—Gary C. Honeycutt; James O. Dixon; Andrew M. Hassell

[57] ABSTRACT

This disclosure provides methods and apparatus for assembling semiconductor devices. A first embodiment provides a method and apparatus for assembling an integrated circuit in which the chip is bonded to a pattern of leads which is disposed on a thin sheet of insulating material and the film is bonded to a lead frame in a single operation. The structure is then encapsulated and the lead frame trimmed to produce a completely packaged integrated circuit. A second embodiment provides a method and apparatus for packaging semiconductor devices in which the semiconductor chips are first bonded to a pattern of leads which are disposed on a strip of thin insulated material. The strip of insulated material is then separated and the conductors bonded to a lead frame. The structure is then encapsulated and the lead frame trimmed to produce a completely packaged integrated circuit.

2 Claims, 11 Drawing Figures

INTEGRATED CIRCUIT ASSEMBLY USING ETCHED METAL PATTERNS OF FLEXIBLE INSULATING FILM

DESCRIPTION OF THE INVENTION AND BACKGROUND INFORMATION

Many methods have been used in the prior art in order to interconnect the integrated circuit chips with the lead frame and to package the resultant structure so as to produce a reliable device. Typical procedures involve the bonding of individual leads from the semiconductor chip to the lead frame. Other prior art approaches include the so-called flip-chip bonding where the chip is inverted and ultrasonically bonded to the pattern of conductors disposed upon a rigid substrate. All of these prior art approaches were either expensive to implement or resulted in structures of relatively low reliability.

This invention solves many of the problems that are associated with prior art packages for integrated circuits. One embodiment of this invention provides apparatus and a method for assemblying an integrated circuit in which the semiconductor chip is bonded to a pattern of electrical conductors disposed of on a thin insulated sheet of H film (Trademark of E. I. DuPont Co.) and the second end of the pattern of conductors is bonded to a lead frame. The conductors are bonded to the semiconductor chip and to the lead frame in a single operation. The resultant structure is then encapsulated and the lead frame trimmed to form a packaged integrated circuit. A second embodiment of the invention provides apparatus and a method for assemblying a semiconductor device in which a plurality of patterned conductors are disposed on a roll of thin H film insulating material. As the thin roll of insulating material is unrolled, semiconductor chips are selectively bonded to the pattern of leads. The thin strip of insulating material is then separated to form individual sheets with each of the sheets having disposed thereon a pattern of conductors to which an integrated circuit chip is bonded. The sheets are then positioned over a lead frame and the conductors are bonded to the lead frame. The completed structure is then encapsulated and the lead frame is trimmed to form a finished integrated circuit package.

Other types of thin electrically insulating films may also be used in the above-discussed embodiments.

DETAILED DESCRIPTION OF THE INVENTION

Figure 1:
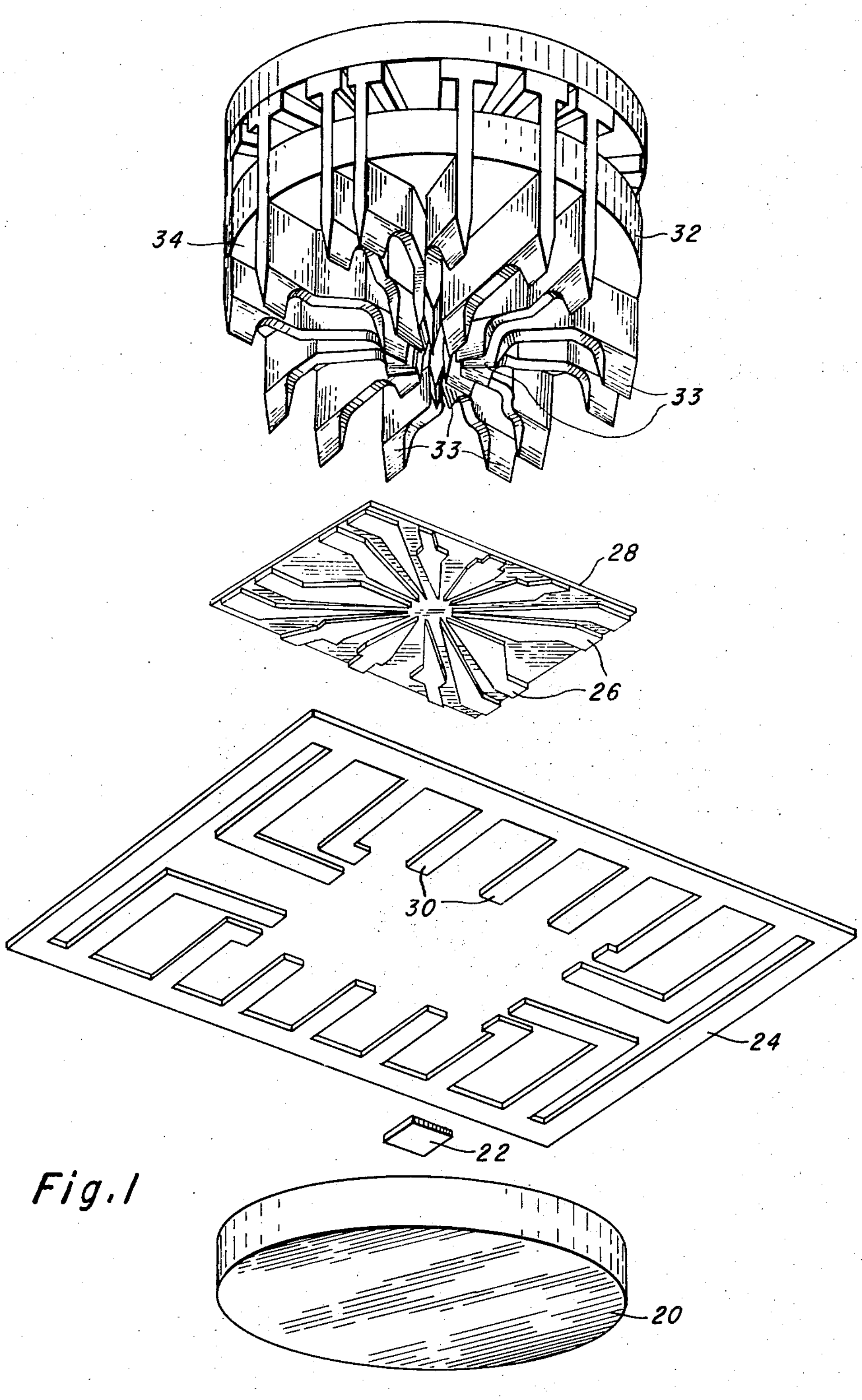
FIG. 1 is a pictorial view of apparatus for bonding conductors disposed on a thin insulating sheet to an integrated circuit chip and to a lead frame.

FIG. 1 illustrates apparatus for simultaneously bonding a pattern of conductors disposed on a thin insulating layer to a semiconductor chip and to a lead frame. The apparatus includes a support plate 20 on which the semiconductor chip 22 and the lead frame 24 are positioned. The semiconductor chip includes metallized bonding pads (not shown) on its upper surface which contact the leads 26 on the thin insulating sheet 28. The lead patterns extend away from the semiconductor chip and contact the inwardly extending portions 30 of the lead frame 24. A bonding tool 32 is then lowered such that it contacts the upper surface of the thin insulating sheet 28. The bonding tool includes a plurality of independently moveable dies 34 with each die having two bonding tips 33, one for bonding the leads to the semiconductor chip 22 and the other for bonding the leads to the lead frame 24. Prior to lowering the bonding tool to contact the upper surface of the insulating sheet 28 the semiconductor chip 22, the lead frame 24, and the pattern of leads 26 are brought to a predetermined temperature as are the tips of each of the bonding dies 34. After the bonding tips have contacted the upper surface of the thin insulating sheet sufficient pressure is applied to each of the tips to thermally compression bond the leads 26 to a lead frame 24 and to the semiconductor chip 22. The pressue is preferably applied to the bonding tips by applying a predetermined weight to the head of each of the dies 34 with the weights being adjusted such that the force of gravity will exert the required pressure on the bonding tips. This method of applying a predetermined force to bonding tips is well known and, therefore, will not be discussed in detail here.

When the metallized bonding pads on the integrated circuit chip 22 are gold or gold plating and the leads on the thin insulated sheet 28 and the lead frame 24 are also gold or gold plating the preferred pressure on the bonding tips is approximately twice the pressure for an equivalent size gold ribbon. Under the aforestated conditions the temperature of the semiconductor chip 22 is between 250° and 450°C, the lead frame 24 and the conductors 26 are unheated and the bonding tips are preferably 250°C.

When the conductors, the lead frame, and the bonding pads on the semiconductor chip are aluminum the temperature of the chip is preferably in the range of 100° to 125°C. The bonding tips and the H film should be maintained at a temperature of about 25°C. Ultrasonic scrubbing may also be used to aid in the aluminum to aluminum bonding process.

Figure 2:
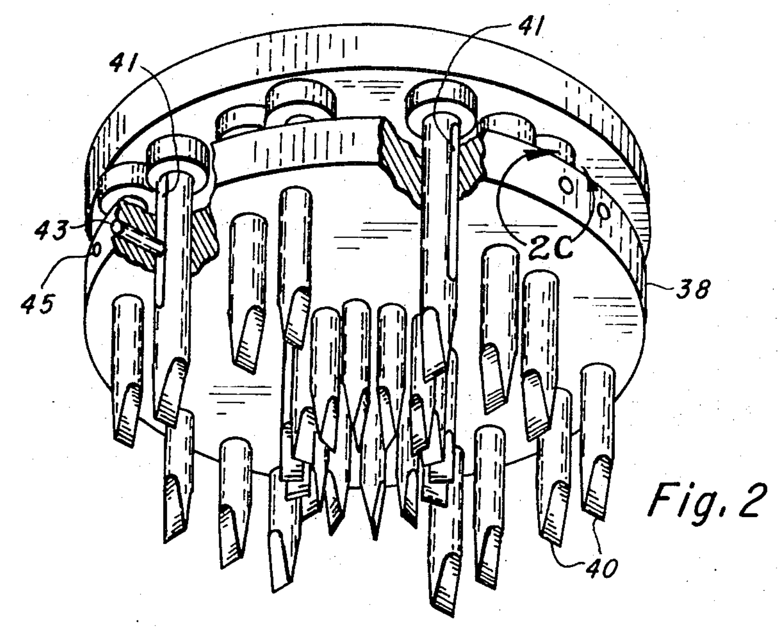
FIG. 2 is a pictorial view of a bonding die in which each of a plurality of bonding tips are independently operated.
Figure 2A:
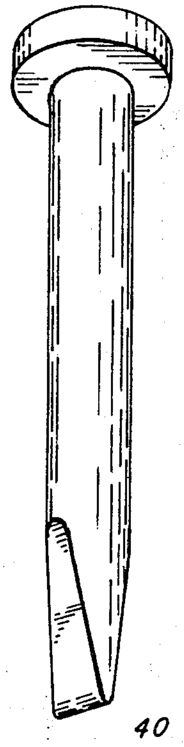
FIG. 2A is a detailed view of a chisel shaped bonding tip.
Figure 2B:
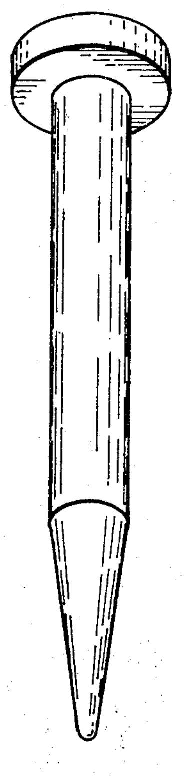
FIG. 2B is a detailed view of a cone shaped bonding tip.
Figure 2C:
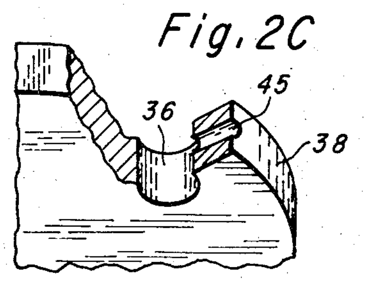
FIG. 2C is a partial view showing in detail an opening in the bonding die illustrated in FIG. 2 in which the individual bonding tips are mounted.

FIG. 2 illustrates another embodiment of the bonding apparatus which is the subject of this invention. This embodiment is similar to the one discussed about except that each of the bonding tips 40 is positioned in an opening 36 is a support member 38 thereby permitting each of the bonding tips 40 to be operated independently. Each of the bonding tips 40 includes a slot 41. A pin 43 is positioned in an opening 45 in the support member 38 such that the pin 43 extends into the slot 41 thereby preventing each of the bonding tips 40 from rotating. This arrangement may be particularly advantageous when the bonding pads on the integrated circuit and the lead frame 24 are made of different metals thereby requiring different bonding conditions for these two interconnections. Other advantages include the capability of bonding a plurality of different patterns using the same bonding set up. Different conductor patterns can be bonded using a fixed pattern of bonding tips by the simple procedure of retracting the unused bonding tips during a bonding step when a connection is not to be made at the point corresponding to that tip. As with the preceding embodiment the pressure is preferably independently, applied to each bonding tips thereby placing a predetermined weight on the end of each individual bonding tip. A typical bonding tip is illustrated in FIG. 2A. The bonding tip 40 is chisel shaped with the point having a width of approximately 0.010 inches and a radius of approximately 0.001 inches. The chisel shaped bonding tip is useable with either of the above-discussed embodiments. Other useable shapes for the bonding tips include the cone shaped tip illustrated in FIG. 2B. The radius forming the tip of the cone is preferably 0.010 inches. FIG. 2C illustrates in detail one of the openings 36 in which the bonding tips 40 are positioned.

Figure 3:
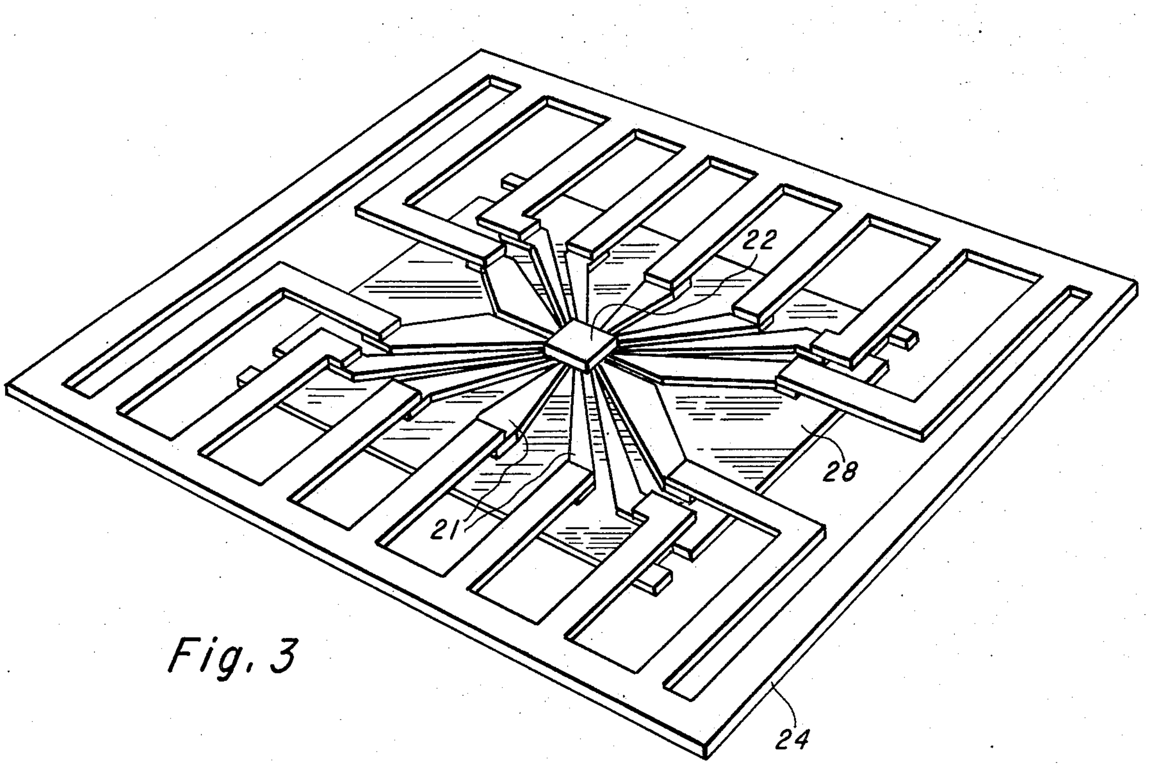
FIG. 3 is a pictorial view of an integrated circuit which may be assembled using the apparatus illustrated in FIGS. 1 or FIG. 2.
Figure 4:
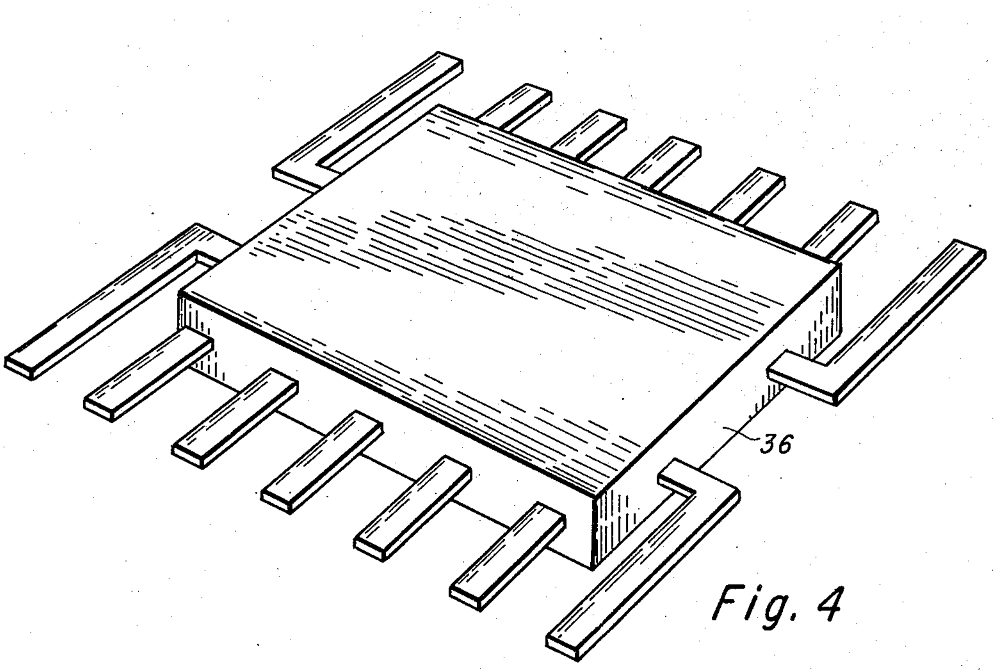
FIG. 4 is a pictorial view of the circuit of FIG. 3 following encapsulation and trimming of the lead frame.

A circuit which includes a semiconductor chip 22, a thin flexible insulating sheet 28 having a pattern of conductors disposed thereon and a lead frame 24 with the pattern of connectors bonded to the circuit chip and the lead frame to form a unified structure is illustrated in FIG. 3. This structure may be assembled using the integrated circuit chip 22, the lead frame 24 and the thin insulating sheet 28 previously illustrated and discussed with reference to the bonding apparatus illustrated in FIG. 1. The bonding necessary to produce this structure can be performed using the apparatus of either FIG. 1 or 2. The structure of FIG. 3 is then placed in a mold and a compound injected into the mold to encapsulate the circuit to provide additional mechanical rigidity and environmental protection for the circuit. The outer bars of the lead frame are then trimmed to produce a completely packaged integrated circuit. The finished circuit 36 is illustrated in FIG. 4.

Figure 5:
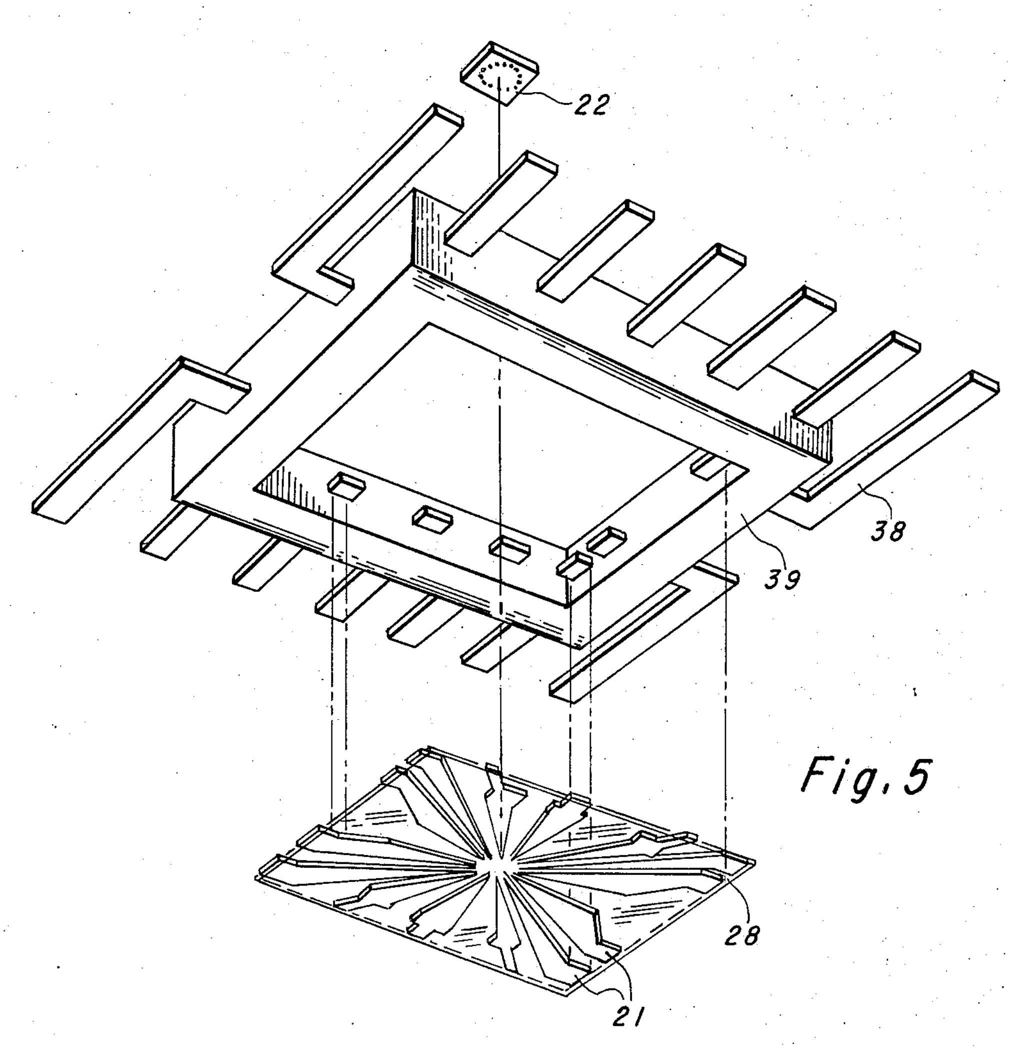
FIG. 5 is an exploded view of a second type of integrated circuit which may be assembled using the apparatus illustrated in FIGS. 1 and 2.
Figure 6:
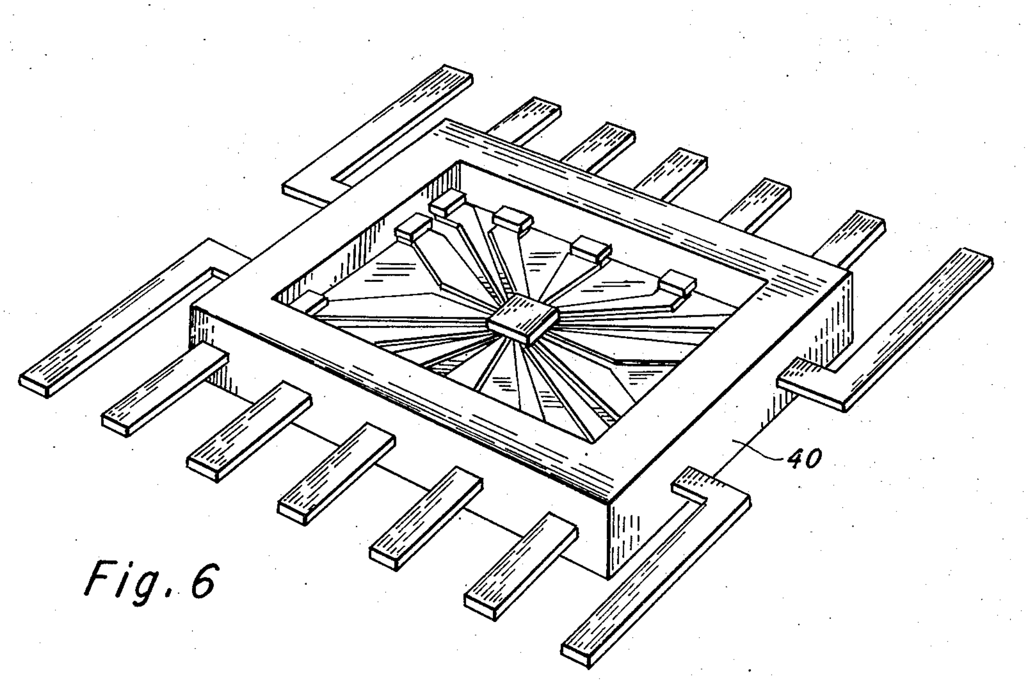
FIG. 6 is a fully assembled view of the integrated circuit illustrated in FIG. 5.

FIG. 5 illustrates the basic components of a second type of integrated circuit which may be assembled using the bonding techniques and apparatus of this invention. The structure includes a semiconductor chip 22 a lead frame 38 and a thin insulating sheet 28 having thereon a pattern of conductors 21. The lead frame 38 comprises a rectangular frame member made of electrically insulating material with a plurality of electrically conductive leads extending from the outer perimeter to the frame to the interior of the frame. The electrically conductive leads extend away from the outer perimeter of the frame to form connectors permitting the integrated circuit to be connected to other circuits. The portion of the leads which extend into the interior of the lead frame provide surfaces to which the pattern of electrically conductive leads 21 disposed on the thin insulating sheet 28 are bonded. The semiconductor chip 22 is also bonded to the pattern of conductors near the central portion of the thin insulated sheet 28. The bonding operations necessary to interconnect the lead patterns with the electrically conductive leads extending through the insulating portion of the lead frame 38 and to bond the semiconductor chip 22 to the conductor patterns can be performed using the apparatus disclosed in either FIG. 1 or FIG. 2. An assembled circuit 40 using the components illustrated in FIG. 5 is shown in FIG. 6.

Figure 7:
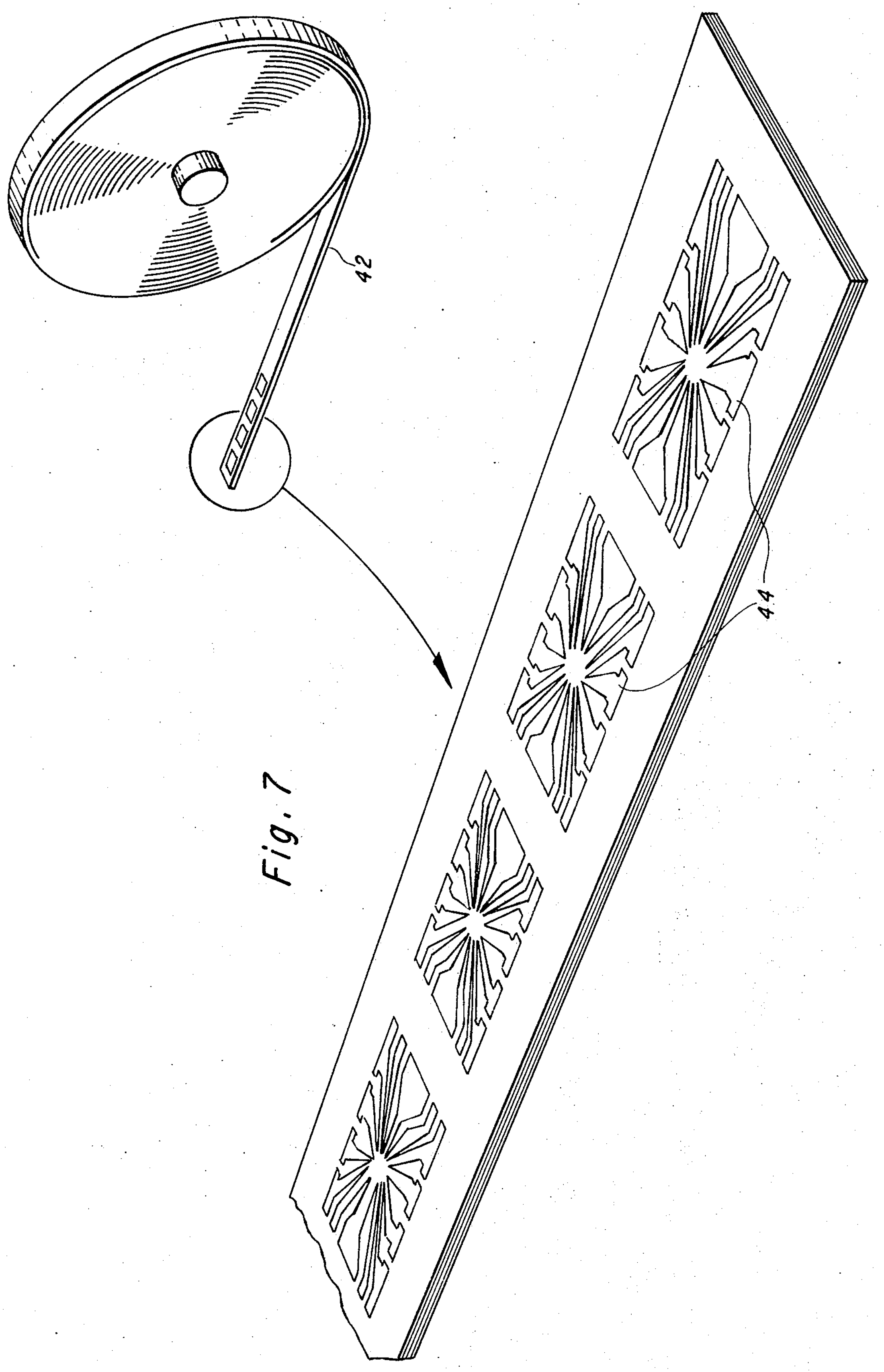
FIG. 7 is a pictorial view of a roll of thin insulating material including a repeating pattern electrical conductors disposed thereon.
Figure 8:
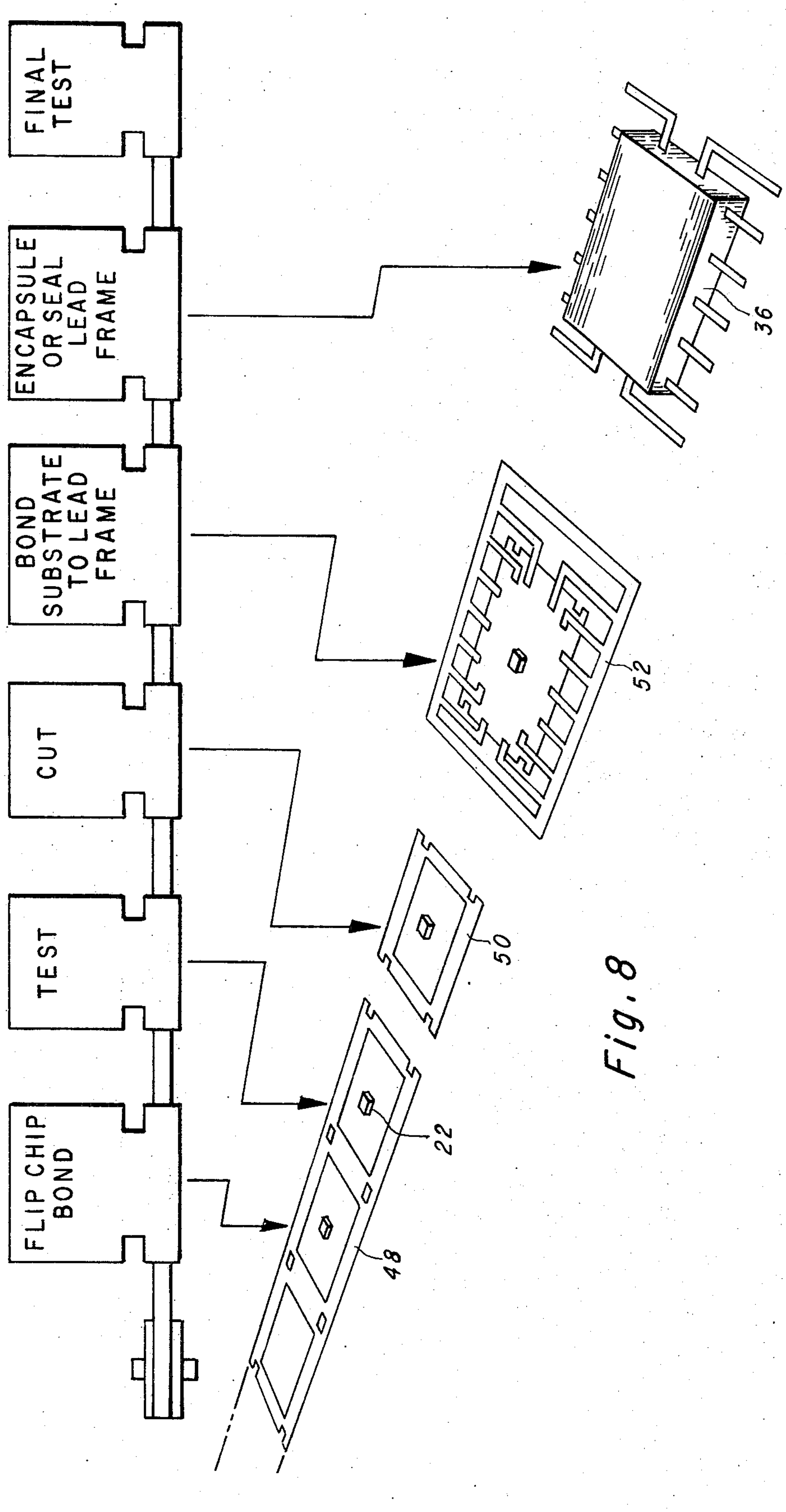
FIG. 8 is a diagram illustrating the sequential steps necessary to assemble an integrated circuit.

The method of assembling a semiconductor device illustrated in FIG. 3 may also be modified by first forming a plurality of patterned electrical conductors on a thin strip 42 of electrically insulated material which can be stored on a roll. The modified method is illustrated in FIG. 8 and a roll or sheet containing a plurality of lead patterns is illustrated in FIG. 7. Semiconductor chips are bonded to each of these patterns of conductors 44 as the thin insulated layer is unrolled from the roll 42. Following the bonding the chips 22 to each of the patterns of conductors 44 the film is separated to form individual sheets 50 (FIG. 8) with each sheet consisting of a pattern of electrical conductors and a semiconductor chip bonded to this pattern. The insulated sheet 50 is then positioned such that the lead pattern contacts a lead frame 52 and the leads are bonded to a lead frame 52. These bonding operations can be performed using the apparatus illustrated in either FIGS. 1 or 2. After the lead frame 52 has been bonded to the pattern of conductors the structure is encapsulated and the lead frames trimmed to form a completely packaged integrated circuit. The various steps of the process and the finished integrated circuit 36 are illustrated in FIG. 8. The process can also be easily modified to assemble other types of integrated circuits packages, the package illustrated in FIG. 6 being one example.

Although the invention has been described and defined in detail with reference to perferred embodiments it will be obvious to those skilled in the art to which the invention pertains that many modifications of the invention may be made by those skilled in such art without departing from the scope of the invention as disclosed and claimed.

What is claimed is:

1. A method for assembling an integrated circuit, the method comprising the steps of:

a. positioning an integrated circuit chip and a lead frame such that the top surfaces of said integrated circuit chip and the top surface of said lead frame are in substantially planar relationship with each other;

b. positioning a sheet of thin insulating material, having a pattern of electrically conductive leads disposed thereon, such that said pattern of leads selectively contacts said integrated circuit chip and said lead frame;

c. contacting the surface of said sheet with a die having a plurality of bonding tips selectively shaped and positioned to register with said pattern of leads at each point where contact is made with said chip and said frame, respectively; and d. applying pressure to said die thereby bonding said pattern of leads to said semiconductor chip, while also bonding said pattern to said lead frame at the same time, thereby forming a structure comprising an integrated circuit chip and a lead frame interconnected by conductive leads.

2. The method of claim 1 further including the steps of:

a. placing said structure in a mold, b. injecting a molten encapsulated compound into said mold; and c. trimming said lead frame to produce a packaged integrated circuit.

* * * * *